United States Patent [19]

Belanger, Jr.

[11] Patent Number: 5,154,631
[45] Date of Patent: Oct. 13, 1992

[54] SUBSTRATE MOUNTING DEVICE

[75] Inventor: Thomas D. Belanger, Jr., Saline, Mich.

[73] Assignee: AG Communication Systems Corporation, Phoenix, Ariz.

[21] Appl. No.: 814,155

[22] Filed: Dec. 30, 1991

[51] Int. Cl.$^5$ ............... H01R 13/629; H05K 1/18
[52] U.S. Cl. ................................. 439/377; 211/41; 361/396; 361/415
[58] Field of Search .............. 439/64, 377; 361/394, 361/395, 399, 412, 413, 415, 419; 211/41

[56] References Cited

U.S. PATENT DOCUMENTS

| | | | |
|---|---|---|---|
| 4,794,488 | 12/1988 | Belanger, Jr. | 361/395 |
| 4,797,784 | 1/1989 | Belanger, Jr. | 361/395 |
| 4,797,786 | 1/1989 | Belanger, Jr. | 361/415 |
| 4,821,149 | 4/1989 | Belanger, Jr. | 361/395 |
| 4,987,516 | 1/1991 | Belanger, Jr. | 361/413 |

*Primary Examiner*—Gary F. Paumen
*Attorney, Agent, or Firm*—Robert J. Black; Gregory G. Hendricks

[57] ABSTRACT

A substrate mounting device for installing an electrical substrate to a carrier substrate. The substrate mounting device includes a plurality of tabs extending from the perimeter edges of the electrical substrate. First and second substrate guides are mounted to the carrier substrate and each include a lower shelf and a channel extending longitudinally along a substrate guide inner side, from an open end to a top guide. The channel is further defined by a top surface and a plurality of drop guides which in turn form a plurality of slots. Also included are a plurality of flaps formed by molded spring back hinges to facilitate insertion from an upward direction. The electrical substrate is installed by manually placing the electrical substrate onto the flapped areas and then depressing in a downward and forward direction, causing the flaps to move in a downward direction allowing the electrical substrate to encounter top guides which act to urge the electrical substrate downward toward the carrier substrate.

7 Claims, 1 Drawing Sheet

SUBSTRATE MOUNTING DEVICE

BACKGROUND OF THE INVENTION

1. Field of the Invention

This invention relates in general to modular electronic circuit devices and more particularly to a device for mounting electrical substrates to a carrier substrate.

2. Background Art

In the past few years, the use of plug-in units for electrical components has found favor within the electronics industry. Such plug-in units generally comprise a structure upon which are mounted electrical assemblies or sub-assemblies, the structure being arranged to be plugged in a suitable socket provided on a base chassis. When so plugged the components carried by the plug-in unit are electrically connected in proper circuit relation to other electrical equipment carried by the base chassis.

Recently, however, with the coming of film circuits, the need for a specialized carrier structure for housing the sub-assembly has disappeared. This is mainly due to the smaller size of a film circuit. Compared to a circuit fashioned of discrete components, the film circuit is appreciably smaller and lighter. It is not uncommon to have film circuits plugged directly into larger circuit cards or other carrier substrates and in turn the larger substrate plugged into the base chassis. At present, most installations of film circuits to circuit cards are done as permanent installations. Therefore, removal and replacement of the film circuits though not impossible, is a tedious and labor intensive job.

One solution to the problem set forth above is embodied in my U.S. Pat. No. 4,821,149 which issued on Apr. 11, 1989. A lower substrate is in this arrangement a carrier substrate incorporate a card guide facilitating the dropping of a flanged or keyed substrate directly onto the carrier substrate as an aid in assembling.

In the arrangement taught therein, the electrical substrate is manually inserted between two guides included on the carrier substrate and pushed forward between the guides. The forward tabs on the electrical substrate are longer than the rear tabs, thus riding over the rear slots during insertion. The substrate is installed further between the guides after which the electrical substrate tabs become keyed in slots in the sides of the guides. Angled surfaces of the slots facilitate the substrate sliding further down onto lower shelf portions of the guides as the electrical substrate is urged forward and in a downward direction. One suggested improvement includes the provision of slotted card guides so that the electrical substrate could be mounted directly from the top of the guides on the carrier substrate. To facilitate factory assembly, however, it was determined while this eliminated the need of inserting the electrical substrate from the end as taught in my prior patent the proposed arrangement if utilized in field sites where the substrate would be removed from the handle end of the guide, the substrate might be found to enter the openings on top of the guides and subsequently the electrical substrate might fall into an adjoining substrate. Accordingly, it is the object of the present invention to disclose a new structure for mounting electrical substrates onto carrier substrates which eliminates some of the problems discovered in connection with previous solutions to the problem.

SUMMARY OF THE INVENTION

In accomplishing the object of the present invention there is provided a substrate mounting device for mounting an electrical substrate to carrier substrate. The electrical substrate of the present invention includes a first pair of tabs each extending from the major perimeter edges of the electrical substrate directly opposite one another. A second pair of tabs located in a spaced relationship to the first pair of tabs also extend from the major perimeter edges of the electrical substrate directly opposite the other.

The substrate mounting device further includes first and second substrate guides located in a spaced and parallel relationship to each other and each including a lower shelf. Each lower shelf includes a bottom surface mounted to the carrier substrate. Each of the substrate guides further include a channel extending longitudinally along an inner side of each respective guide from an open end to a top guide. First and second drop guides further define first and second slots.

Also included in the guides are one or more flaps to cover openings provided on the top of each of the substrate guides. Openings on the top of the guides facilitate the assembly of the electrical substrate on the carrier substrate by insertion from the top rather than by inserting directly at the end into the substrate guides. The inclusion of a flap is designed to allow the placement of the electrical substrate from the top during factory assembly. The flap then springs back to close the opening to keep the substrate in the guide during field removal. The flap would probably be molded as part of the guide or assembled in a secondary operation as a separate device. Also included as part of the guide arrangement is the use of an angled ramp at the opening to move the substrate flange downward so that it does not enter the opening during removal.

The electrical substrate and the tabs are manually inserted by depressing the electrical substrate flanges onto the flaps and at the same time urging it in a downward and forward direction thus inserting the carrier substrate manually into the guides.

The electrical substrate rides along the top surface until the substrate encounters the top guide. Each respective top guide urges the electrical substrate downward whereby the first tab and the second tab fall within respective first and second slots on each of the first and second substrate guides thereby, resting the electrical substrate guide on the lower shelf.

The electrical substrate is normally provided with some means of electrical connection device which would contact or mate with similar devices mounted on the carrier substrate. This could provide for electrical connections between the electrical substrate and the carrier substrate.

BRIEF DESCRIPTION OF THE DRAWINGS

A better understanding of the present invention may be had from a consideration of the following detailed description taken in conjunction with the accompanying drawings in which.

DESCRIPTION OF THE PREFERRED EMBODIMENT

Figure 1:
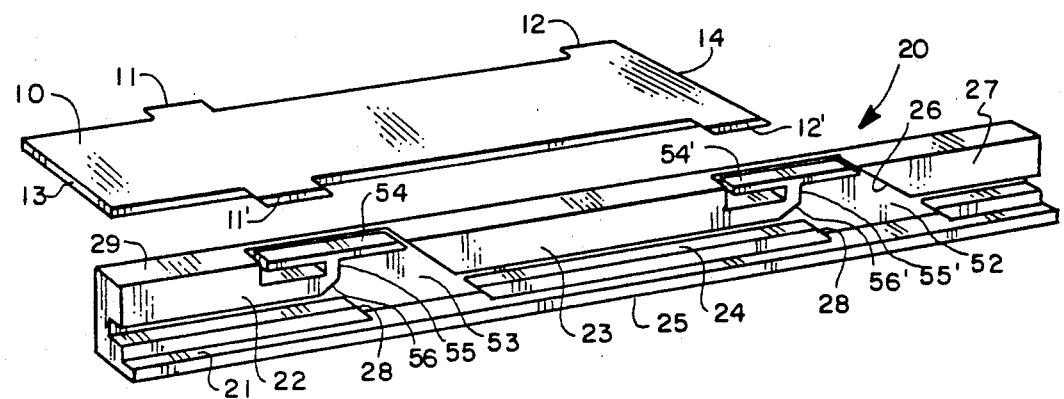
FIG. 1 is a perspective view of an electrical substrate and substrate guide of the present invention.
Figure 2:
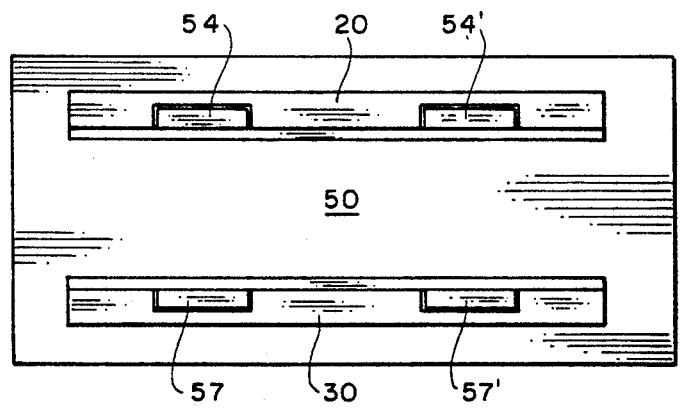
FIG. 2 is a top plan view of the substrate mounting device of the present invention mounted on a carrier substrate.

Turning now to FIG. 1 of the included drawings, the device in accordance with the invention includes a planar electrical substrate 10 having a first set of tabs 11, 11' extending outward from the edges of the substrates 10 major sides. A second set of tabs 12, 12' also extend outward from the major sides of the electrical substrate 10. As can be seen in FIG. 1 the first set and second set of tabs extend outward of the electrical substrate in the same horizontal plane. The electrical substrate further includes a handle end 13 and a lead edge 14.

Guide 20 (a left side substrate guide) is an integrally molded unit comprised of a slot or channel 24 extending longitudinally along inner side of guide 20. Both the forward and rear drop guides include ramped ends 28 to aid in the positioning and removal of the substrate 10. Further, the top guide 27 includes an angled surface 26 which also aids in the installation of substrate 10 and which will be explained in detail later. Finally, guide 20 includes a lower shelf 21 and a generally planar bottom surface 25 for mounting the guide to a carrier substrate.

Included in the planar top cap or surface 29 are two molded flaps 54, 54' which aid in facilitating factory assembly of the electrical substrate to the carrier substrate. As may be seen in FIG. 1, the flap is intended to be depressed in a downward and forward direction and sealed automatically. It is typically supported by a molded spring back hinges 55 and 55' which are a part of the top cap 29. Extending in a downward direction from the molded spring back hinges 55 and 55' are angle ramps 56 and 56' which facilitates or prevents lock up during withdrawal for any reason of the electrical substrate from the carrier substrate.

The left substrate guide 20 shown in FIG. 1, and a right substrate guide 30 form the substrate mounting device of the present invention shown in FIG. 1. The right substrate guide 30 is a mirror image in structure to guide 20.

The substrate mounting device of the present invention is attached by any convenient means to the top surface of a carrier substrate 50 such as a circuit card, backplane, or other electrical substrate.

With renewed reference to FIG. 1 an explanation of the installation of the substrate 10 within the substrate mounting device of the present invention will be explained in detail. It should be noted that the installation will use only the left substrate guide 20 shown in FIG. 1. It will be appreciated by those skilled in the art that an identical insertion procedure occurs simultaneously in guide 30 as the substrate is installed.

The electrical substrate 10 including tabs 11 and 12 is positioned on top of top cap 29 and particularly with the tabs positioned over flaps 54 and 54'. The substrate is then depressed in a downward and forward direction against the flaps, at which time the flaps will fold in a forward direction allowing the substrate to pass past the top cap 29. After the substrate 10 has moved in a downward motion and the substrate is installed and resting on the lower shelf 21, the flaps 54 and 54' because of the molded spring back hinge, assume their normal position as a portion of the top cap 29 and block exit of electrical substrate 10 (as seen in FIG. 3) from the guide via the upper surface so as to not cause possible problems in field operation or disassembly.

During insertion the substrate 10 rides forwardly along the forward drop guide 22, rear drop guide 23 and the top guide 27.

The substrate 10 is installed further into guide 20 and substrate tabs 11 and 12 become keyed to slots 53 and 52 respectively. Angled surface 26 of top guide 27 insures that substrate 10 follows a downward motion as it is further pushed within the guide. Angled surfaces 28 on the rear and forward drop guides facilitate the substrate sliding down onto the lower shelf 21 as the top guide 27 pushes the substrate downward.

Finally, the substrate is fully installed when the electrical substrate rests completely on the lower shelf 21.

Removal of the electrical substrate 10, if necessary, can be accomplished by pulling the substrate 10 out of the guide 20 in an opposite direction to that of installation, via channel 24. To facilitate this, a lifting action is provided by angled ends 28 of the drop guides 23 and 22. Once the substrate 10 is within channel 24 the substrate can be pulled out directly and withdrawn from the guide.

It will be appreciated by those skilled in the art that the substrate 10 can be provided with some means of electrical connection devices which would contact or mate with similar devices mounted on carrier substrate 50. This would provide electrical connection between substrate 10 and the carrier substrate 50.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A substrate mounting device assembly for mounting an electrical substrate to a carrier substrate comprising:
   a first pair of tabs each extending from a major perimeter edge of said electrical substrate directly opposite each other;
   a second pair of tabs located in a spaced relationship to said first pair of tabs and said second pair of tabs each extending from a perimeter edge of said electrical substrate directly opposite each other;
   first and second substrate guides located in a spaced and parallel relationship to each other and each including a lower shelf with each lower shelf having a top and a bottom surface, and each bottom surface mounted to said carrier substrate, each of said substrate guides further including a channel longitudinally oriented along a first side thereof, and each of said channels including an open end and a top guide, and each channel extends between said open end and said top guide, each channel further defined by first and second drop guides, said first and second drop guides located on said lower shelf top surface, said first and second drop guides further defining first and second tab receiving slots;
   said top surface including a plurality of flaps supported by molded spring back hinges to facilitate insertion of said electrical substrate in said carrier substrate;
   said electrical substrate and said first pair and said second pair of tabs arranged to be manually positioned on top surfaces of said substrate guides and manually depressed in a downward and forward motion;

said flaps moved in a forward and downward direction in response to said manual depression, allowing said electrical substrate to be manually pushed between said guides, whereby, said first pair of tabs and said second pair of tabs fall within respective first and second tab receiving slots, resting said electrical substrate and said first and second pair of tabs on a respective first and second substrate guide lower shelf top surfaces.

2. A substrate connector guide assembly for mounting and electrically connecting an electrical substrate to a carrier substrate comprising:

first tab means located on a first perimeter edge of said electrical substrate;

second tab means located on a second perimeter edge of said electrical substrate directly opposite said first tab means;

first and second guide means including a lower shelf mounted to said carrier substrate in a spaced and parallel relationship to each other, each of said guide means further including a channel longitudinally oriented along a first side thereof, and each channel extending between an open end and a terminating end, and each guide means further including at least one tab means accepting slot;

a top surface of each guide means including a plurality of flaps supported by molded spring back hinges to facilitate insertion of said electrical substrate;

said electrical substrate and said first and second tab means arranged to be manually positioned on said top surfaces of said guide means and manually depressed in a downward and forward motion;

said flaps moved in a forward and downward direction responsive to said depression, allowing said electrical substrate to be pushed along each of said guide means toward said terminating end, said first tab means and said second tab means falling within respective first and second tab means accepting slots, resting said electrical substrate on the first and second guide means lower shelves.

3. The substrate connector guide assembly as claimed in claim 2, wherein:

said first tab means is a pair of tab members oriented in tandem, extending from a first major perimeter edge of said electrical substrate.

4. The substrate connector guide assembly as claimed in claim 3, wherein:

said second tab means is a second pair of tab members oriented in tandem directly opposite of said first tab means, extending from a second major perimeter edge of said electrical substrate.

5. The substrate connector guide assembly as claimed in claim 4, wherein:

each of said first and second guide means lower shelves includes top and bottom surfaces and each first and second guide means channels is defined by a top surface and first and second drop guides positioned in tandem, said guide means first and second drop guides further defining first and second tab member accepting slots.

6. The substrate connector guide assembly as claimed in claim 5, wherein:

said top surface of said guide means each further including said flaps whereby said first and second pair of tab members are inserted and depressed past said flaps in a forward and downward direction into said first and second guide means, said electrical substrate manually pushed said first and second pair of tab members falling within respective first and second tab member accepting slots.

7. The substrate connector guide assembly as claimed in claim 6, wherein:

each of said first and second guide means terminating ends is a top guide, and each top guide is arranged to contact said electrical substrate, thereby urging said electrical substrate in a direction toward said first and second drop guides.

* * * * *